United States Patent
Economikos et al.

[11] Patent Number: 6,136,664
[45] Date of Patent: Oct. 24, 2000

[54] FILLING OF HIGH ASPECT RATIO TRENCH ISOLATION

[75] Inventors: Laertis Economikos, Wappingers Falls; David Edward Kotecki, Hopewell Junction; Jack A. Mandelman, Stormville, all of N.Y.

[73] Assignee: International Business Machines Corporation, Armonk, N.Y.

[21] Appl. No.: 08/908,296

[22] Filed: Aug. 7, 1997

[51] Int. Cl.[7] .................................................. H01L 21/76
[52] U.S. Cl. .......................... 438/431; 438/435; 438/437; 438/430
[58] Field of Search .................................. 438/430, 431, 438/432, 435, 437

[56] References Cited

U.S. PATENT DOCUMENTS

| | | | |
|---|---|---|---|
| 4,486,266 | 12/1984 | Yamaguchi | 156/643 |
| 4,626,317 | 12/1986 | Bonn | 438/432 |
| 4,631,803 | 12/1986 | Hunter et al. | 29/576 W |
| 4,810,668 | 3/1989 | Ito | 438/432 |
| 4,835,115 | 5/1989 | Eklund | 437/38 |
| 4,876,214 | 10/1989 | Yamaguchi et al. | 437/38 |
| 4,983,226 | 1/1991 | Hunter et al. | 148/33.2 |
| 5,061,653 | 10/1991 | Teng | 437/67 |
| 5,116,779 | 5/1992 | Iguchi | 438/432 |
| 5,189,501 | 2/1993 | Kawamura et al. | 257/647 |
| 5,217,919 | 6/1993 | Gaul et al. | 437/67 |
| 5,248,894 | 9/1993 | Beasom | 257/519 |
| 5,387,538 | 2/1995 | Moslehi | 438/431 |
| 5,387,539 | 2/1995 | Yang et al. | 437/67 |
| 5,455,194 | 10/1995 | Vasquez et al. | 437/67 |
| 5,496,765 | 3/1996 | Schwalke | 438/432 |
| 5,498,566 | 3/1996 | Lee | 437/67 |
| 5,561,073 | 10/1996 | Jerome et al. | 437/31 |
| 5,576,241 | 11/1996 | Sakai | 438/432 |

*Primary Examiner*—Trung Dang
*Attorney, Agent, or Firm*—Jenkens & Gilchrist; Jay H. Anderson

[57] ABSTRACT

A method of forming a trench isolation on a semiconductor substrate comprising the steps of forming a trench in the substrate, partially filling the trench with a first layer of polysilicon, oxidizing the first layer of polysilicon, partially filling the trench with at least a second layer of polysilicon, and oxidizing the second layer of polysilicon. By utilizing the method of the present invention, formation of voids and defects in a trench isolation having a high aspect ratio can be prevented.

24 Claims, 4 Drawing Sheets

FILLING OF HIGH ASPECT RATIO TRENCH ISOLATION

FIELD OF THE INVENTION

The present invention relates to methods of manufacturing semiconductor devices and, more specifically, to a method for forming a trench isolation on a semiconductor substrate.

BACKGROUND OF THE INVENTION

Shallow trench isolation (STI) is a technique used for isolating active devices on a silicon substrate. This technique has been successfully used in both high performance logic chips as well as memory (e.g., DRAM and SRAM) chips. As the density of the transistors continues to increase, the amount of space separating the active devices decreases, causing the aspect ratio of the shallow trench to increase (i.e., the depth of the trench/the width of the trench becomes greater). With this increase in aspect ratio, it becomes more difficult to fill the shallow trench with an insulator (e.g., silicon dioxide) in such a way that there are no voids or seams in the insulating layer, and to produce a fully planarized surface at the completion of the STI process.

Various process sequences to form a shallow trench, isolation are described in "Silicon Processing for the VLSI Era," Vol. 3, by S. Wolf, Lattice Press, Sunset Beach, Calif., pp. 367–413. All of these techniques rely on the deposition of a dielectric film and various planarization techniques (e.g., chemical mechanical polishing, RIE etch back, etc.) to generate the isolation structure.

Memory capacities of Very Large Scale Integrations represented by DRAM (Dynamic Random Access Memory), SRAM (Static Random Access Memory), and so on, have been increasing to be four times as large every three years. The DRAMs mainly manufactured at present are 64 Mb to 256 Mb. DRAMs of 1 Gb and 4 Gb which will be mainly manufactured in the near future are being studied. It is easily forecasted that DRAMs will progress to have memory capacities of 16 Gb, and then, of 64 Gb.

Such increases in the packing density in a limited chip area have been realized by reduction in size of semiconductor devices consisting of a circuit or circuits. For example, the minimum size of MOS transistors used for a 1 Mb DRAM is about 1 μm, while the size will decrease significantly for 1 Gb DRAM. In addition to the reduced size of semiconductor devices, isolation regions positioned between the semiconductor devices on a chip are also related to the realization of the increase in the packing density. Specifically, a reduction of the isolation regions is indispensable to the increase in the packing density, and an isolation width comes to be required to be very small at 1 Gb DRAM generation.

Generally, the isolation regions are constructed of silicon dioxide which can be formed in the following way by a selective oxidation method. Unmasked portions of a silicon nitride film covering a silicon substrate are etched away, and then an exposed surface of the silicon substrate is selectively oxidated to form the silicon oxide which serves as an insulator.

This selective oxidation method, however, has revealed the following problems as the semiconductor device regions and the isolation regions therebetween decrease. First, the oxidation of the silicon substrate during the selective oxidation process progresses even to regions covered with the silicon nitride film, and as a result, a silicon dioxide film called a bird's beak spreads. Therefore, there is a limit in the reduction of the isolation regions. Second, a long oxidation process time is required. Because of this, the silicon substrate suffers from stresses and is flawed. As a result, characteristics of the semiconductor devices fabricated on the substrate deteriorate.

A trench-filling-up isolation method has been proposed as an alternative method of the selective oxidation method to solve the above mentioned problems. This method consists of forming rectangular trenches in a silicon substrate and filling the trenches up with a silicon oxide layer or other layers. According to this method, only the trench regions serve as isolators. Therefore, the reduction of the isolation regions is possible. In addition, because this method has no thermal process over a long time, deterioration in the substrate characteristics is prevented.

The trench-filling-up method is an isolation method suitable for the fabrication of semiconductor integrated circuits of high packing density. However, this method has the following problems.

FIG. 1 is a schematic sectional view showing an isolation region formed by the above described conventional trench-filling-up method. In FIG. 1, a reference numeral 20 designates a silicon substrate on which a trench 21 is formed by a reactive ion etching (RIE) method. A reference numeral 22 is a silicon dioxide layer which fills up the trench 21. The silicon oxide layer 22 is first grown by a CVD (Chemical Vapor Deposition) method and then processed to lead to the state as shown in FIG. 1. Disadvantageously, a very small ditch or void 23 is generated on the surface of the silicon dioxide layer in the trench 21 for the following reason. The silicon dioxide layer 22 for filling up the trench 21 grows not only on the bottom of the trench 21 but also on the sides thereof and at almost the same speed. Accordingly, in such a narrow trench as has a width "a" and a depth "b", the silicon dioxide layer 22 growing from the opposite sides of the trench 21 collide with each other in the middle of the trench 21 and a junction 24 is formed to a predetermined depth. The union of the silicon oxide layer 22 at the junction 24 is so weak that the silicon dioxide is easily etched along the junction 24 during a rinse process using a dilute hydrofluoric acid which is an indispensable process in the silicon semiconductor fabrication process, thus the small ditch generates.

Generally, formation of a gate insulator film and metallization for a gate electrode wiring for a MOS transistor follow the formation of the isolation regions. At this time, if small ditches exist in the isolation regions, cutting of the wiring takes place. In addition, if wiring materials remain in the small ditch, a short circuit takes place.

As the ratio of depth b to width a (also referred to as the aspect ratio) increases for both DRAMs and CMOS, it becomes more difficult to achieve within wafer and wafer-to-wafer uniformity and reproducibility in the filling process. As explained above, the filling process produces voids along the center of the trench, and these voids impose reliability problems during subsequent etching processes as well as areas of stress concentration which impact the lifetime of the device. What is needed is an improved filling process for trench isolations having aspect ratios greater than two.

SUMMARY OF THE INVENTION

Accordingly, the present invention overcomes the deficiencies of the prior art by providing a method of forming a trench isolation on a semiconductor substrate comprising the steps of forming a trench in the substrate, partially filling the trench with a first layer of silicon, oxidizing the first layer of silicon, partially filling the trench with at least a second layer of silicon, and oxidizing the second layer of silicon.

The present invention also provides a method of manufacturing a semiconductor device, comprising the steps of providing a silicon substrate, forming a trench in the substrate, partially filling the trench with a first layer of silicon, oxidizing the first layer of silicon, partially filling the trench with at least a second layer of silicon, and oxidizing the second layer of silicon.

The present invention also provides a method of forming a trench isolation on a semiconductor substrate having a trench, comprising the steps of filling the trench with multiple layers of silicon and oxidizing each layer of silicon before filling the trench with the next layer of silicon or after filling the trench with the last layer of silicon.

The present invention also provides a semiconductor device comprising a semiconductor substrate and includes a trench formed in the substrate. The trench is filled by one or more silicon oxide layers having an etch rate equal to that of thermal oxide.

The primary advantage of the present invention is the reduction of defects and voids generated during the trench isolation filling process.

Another advantage of the present invention is reduced thermal budget due to the low temperature oxidization process utilized.

Other advantages that the method of the present invention provide are:

(a) the ability to produce an insulating layer in a shallow trench with high (>2:1) aspect ratios without forming seams or voids in the dielectric layer;

(b) the ability to form an insulating layer in the shallow trench with low stress, an important consideration in STI structures;

(c) the ability to form a STI structure with minimum surface topology resulting in a structure which is easy to planarize; and (d) the ability to form a dense oxide with low shrinkage rate in order to minimize variation of the voltage threshold in the array device.

DETAILED DESCRIPTION OF A PREFERRED EMBODIMENT OF THE INVENTION

The present invention provides a method suitable for producing a film of silicon dioxide (SiO2) in a shallow trench. This method includes the deposition of a highly conformal film of polycrystalline or amorphous silicon and its subsequent oxidation to form the insulating layer.

Two process flows for the formation of a STI structure according to the present invention are described below: a single polycrystalline silicon deposition followed by an oxidation step, and a repeated process which consists of multiple depositions of the polycrystalline silicon layer and the oxidation processes.

Figure 1:
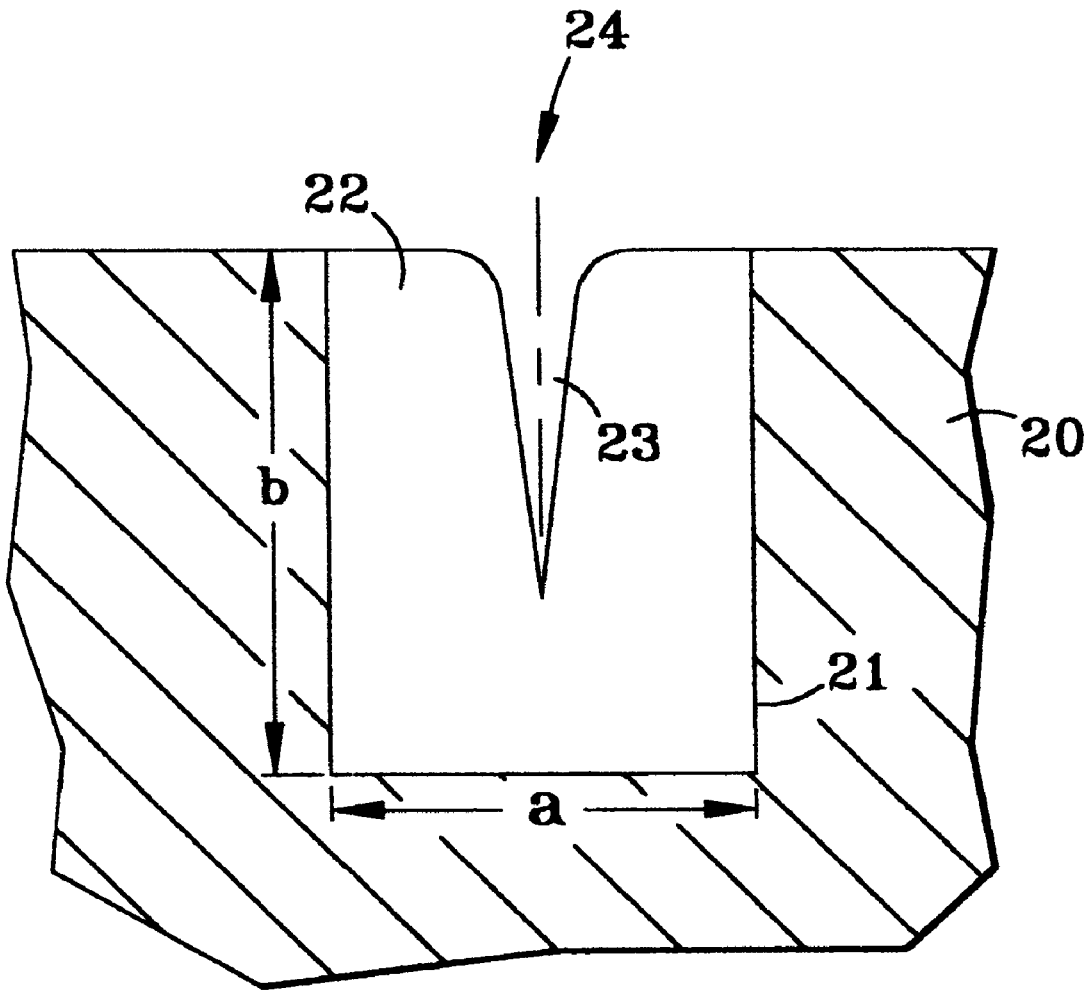
FIG. 1 is a prior art illustration for illustrating the problems inherent in prior art trench filling processes in trench isolation.
Figure 2A:
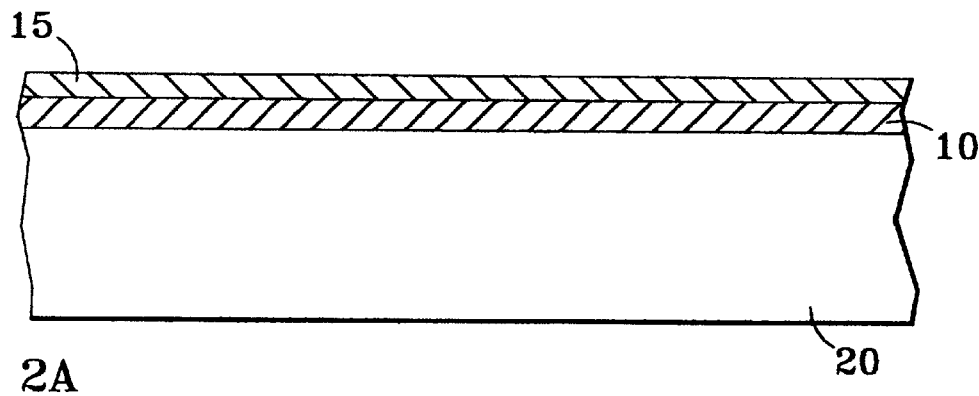
FIGS. 2A–2F illustrate a method according to the present invention.
Figure 2B:
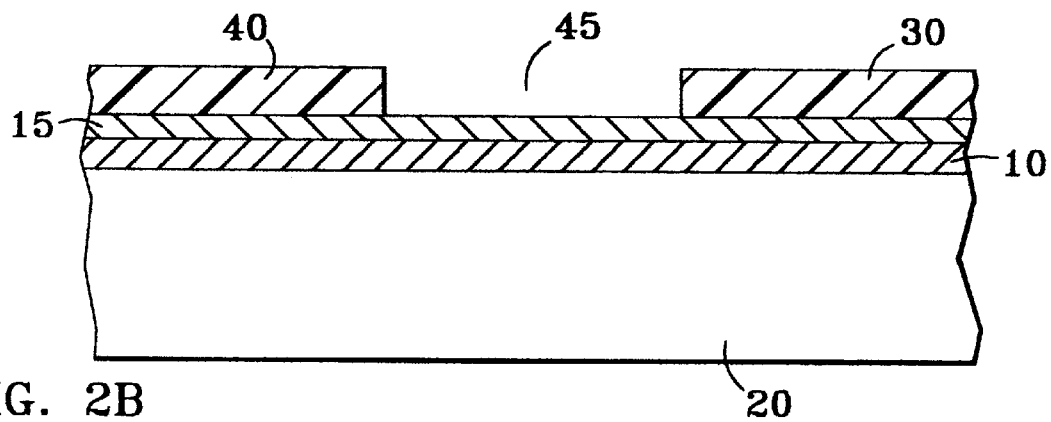
Figure 2C:
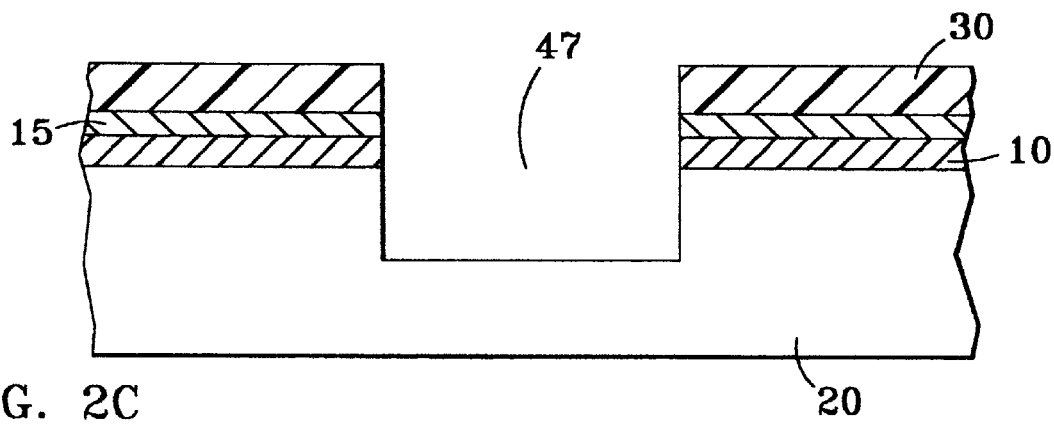

For both of these processes, a stack of dielectric layers typically consisting of a pad oxide 10 and a layer of silicon nitride 15 are deposited on a silicon substrate 20 by chemical vapor deposition or plasma enhanced chemical vapor deposition techniques which are well known in the art (see FIG. 2A). Photolithographic techniques are used to pattern photoresist 30 to define the active areas 40 and isolation regions 45 in the silicon substrate 20 (FIG. 2B). An etch technique is then used to pattern the dielectric films 10 and 15 and the silicon substrate 20 producing the structure shown in FIG. 2C. Trench 47 is thus formed in the silicon substrate 20.

This etch process can be done by reactive ion etching, ion beam etching, or other techniques widely used in silicon processing. After the photoresist layer 30 is removed, a thin layer of silicon nitride 50 3–5 nm in thickness is deposited on the substrate by low pressure chemical vapor deposition. This silicon nitride layer serves as an oxygen diffusion barrier during subsequent processing and can also be used as a stress relief layer.

Figure 2D:
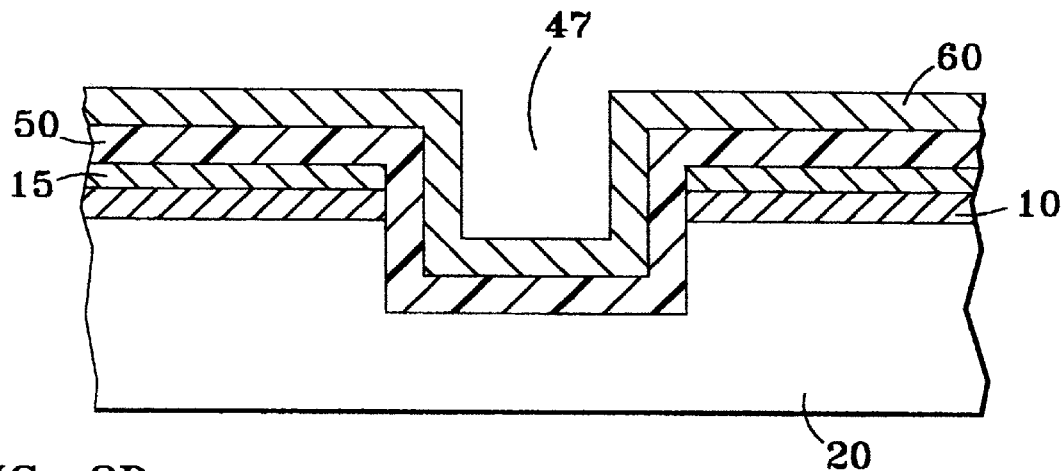
Figure 2E:
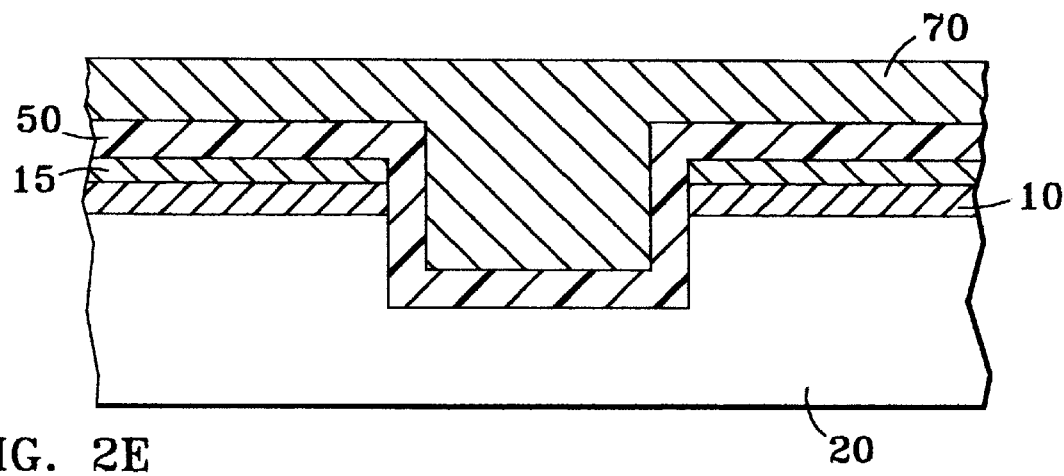
Figure 2F:
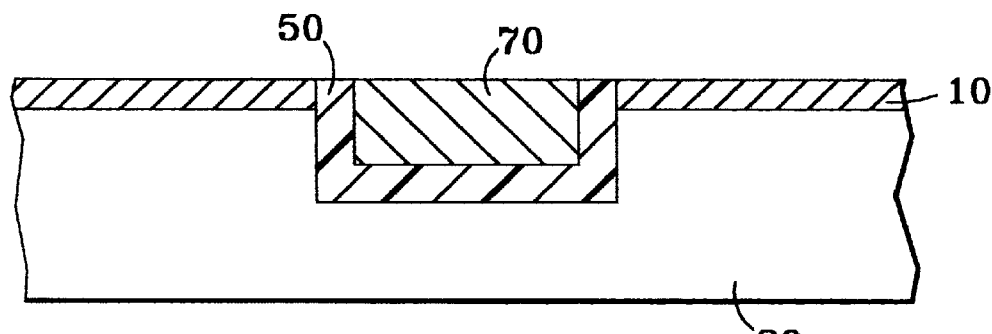

Next, a layer of polycrystalline silicon or amorphous silicon 60 is deposited on the surface by low pressure chemical vapor deposition as shown in FIG. 2D. The thickness of the polysilicon layer for the single step process will be approximately two-thirds the depth of the trench 47. Next, the substrate is subjected to an oxidation process which could include high pressure wet oxidation using H2O and O2 at a pressure from 5–20 atmospheres and a temperature from 650–800° C. to convert the amorphous silicon or polycrystalline silicon to an insulating layer of silicon dioxide 70 as shown in FIG. 2E. Finally, the substrate is planarized back down to the pad oxide 10 using chemical mechanical polishing or a reactive ion etchback technique to produce the final structure shown in FIG. 2F.

Figure 3:
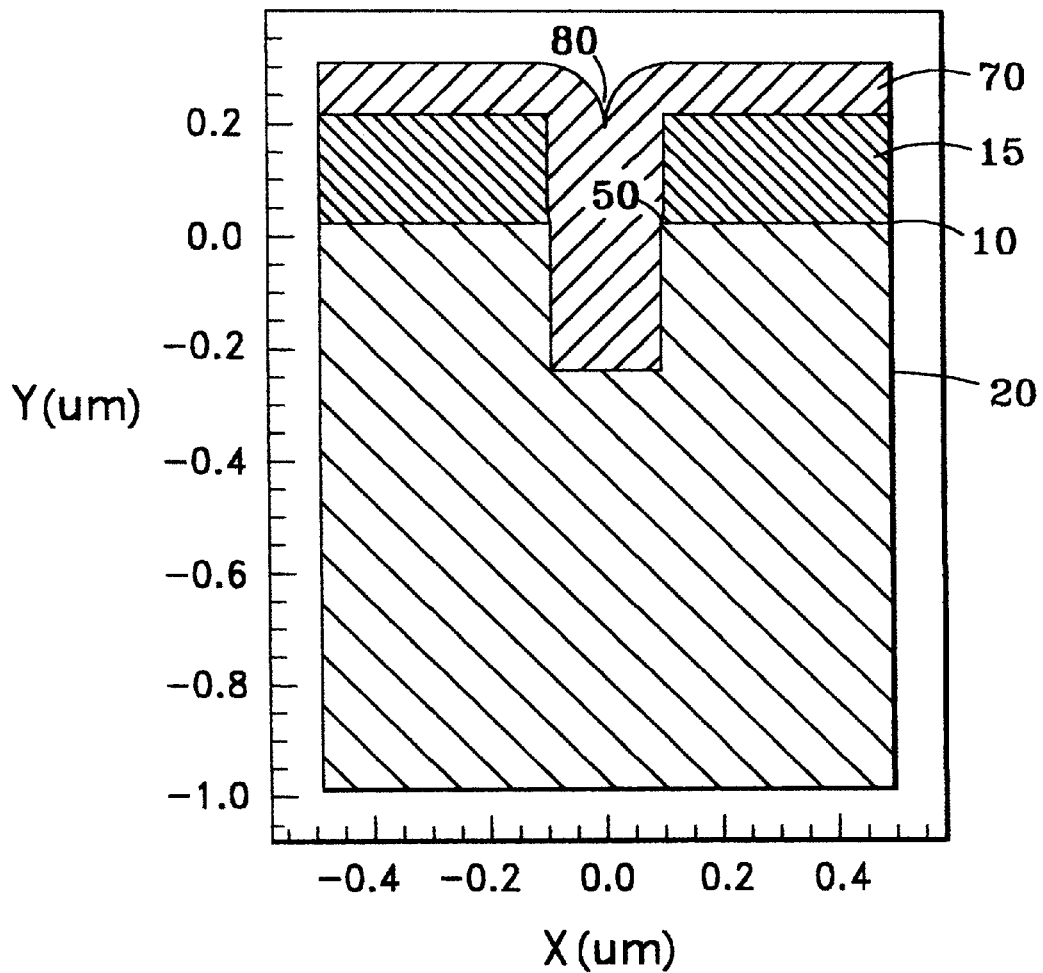
FIG. 3 illustrates a simulation of a trench isolation performed using a method according to the present invention.

FIG. 3 shows the results of a simulation when using the method according to the present invention to fill a shallow trench with a width of 175 nm and a depth of 250 nm in a substrate which had a 20 nm thick pad oxide and a 200 nm thick pad nitride layer in the original on the silicon surface. In this simulation, a 35 nm thick layer of amorphous silicon was deposited on this structure and subjected to an oxidation at 800° C., 20 atm, for 120 minutes. The final structure is shown in FIG. 3. As can be seen, in the regions below the pad oxide 10, the amorphous silicon completely oxidized to form a contiguous layer of silicon dioxide. There are no seams or voids observable below pad oxide 10. A seam 80 is formed during oxidation, but it is contained in the region above the pad oxide 10 in the nitride 15 region. The nitride 15 will be removed in subsequent process steps, and thus, the formed seam will not exist in the final structure.

In addition to the process flow described above, another embodiment of this invention consists of using a multiple sequence of amorphous (or polycrystalline) silicon deposition and oxidation steps. As the aspect ratio of the shallow trench continues to increase, it may be necessary to deposit a thinner layer of polysilicon, with a thickness approximately one-third the depth of the trench, followed by an oxidation process which converts the amorphous silicon to silicon dioxide, followed by a second deposition of amorphous silicon, with a thickness approximately one-third the depth of the trench, and another oxidation. By using a multiplicity of deposition and oxidation steps, higher aspect ratio trenches can be filled with the silicon dioxide dielectric without producing voids or seams in the dielectric layer.

The resulting semiconductor device structure of the isolation trench formed according to the method of the present invention is relatively denser compared to isolation trenches formed using fill methods such as LPTEOS. Whereas the LPTEOS process fills isolation trenches with an oxide having an etch rate 2.1 times faster than that of thermal oxide, the fill process according to the present invention fills the isolation trench with an oxide having an etch rate in a hydrofluoric bath, for example, equal to that of thermal oxide. Furthermore, the corners of the trench at the bottom might be slightly rounded if a thick film of polysilicon is used along with an aggressive oxidation. In this case, traces of polysilicon left unoxidized may be present.

Although the present invention and its advantages have been described in detail, it should be understood that various changes, substitutions and alterations can be made herein without departing from the spirit or scope of the invention as defined in the appended claims.

What is claimed is:

1. A method of forming a trench isolation on a semiconductor substrate, comprising the steps of:
    forming a trench in said substrate, the trench having side walls and a bottom;
    partially filling said trench with a first layer of silicon, so that the bottom of the trench is covered by said first layer of silicon;
    oxidizing said first layer of silicon, so that the bottom of the trench is covered by an oxide of silicon;
    partially filling said trench with at least a second layer of silicon; and
    oxidizing said second layer of silicon,
    wherein said trench is partially filled with said second layer of silicon after said first layer of silicon is oxidized.

2. The method, as recited in claim 1, further comprising the step of forming a layer of nitride in said trench prior to filling said trench with said layers of silicon.

3. The method, as recited in claim 1, further comprising the steps of:
    forming a layer of pad oxide on said substrate prior to forming said trench;
    forming a layer of silicon nitride on said layer of pad oxide;
    forming a patterned masking layer on said layer of silicon nitride; and
    etching said silicon nitride layer, said pad oxide layer, and said substrate to form said trench.

4. The method, as recited in claim 1, wherein said trench has a predetermined width and a predetermined depth.

5. The method, as recited in claim 4, wherein the ratio of said depth to said width is greater than two.

6. The method, as recited in claim 4, wherein said first layer of silicon is approximately one-third of said depth of said trench.

7. The method, as recited in claim 4, wherein said second layer of silicon is approximately one-third of said depth of said trench.

8. The method, as recited in claim 1, wherein said first layer of silicon comprises amorphous or polycrystalline silicon.

9. The method, as recited in claim 1, wherein said second layer of silicon comprises amorphous or polycrystalline silicon.

10. A method of manufacturing a semiconductor device, comprising the steps of:
    providing a silicon substrate;
    forming a trench in said substrate, so that the trench has side walls and a bottom;
    partially filling said trench with a first layer of silicon, so that the bottom of the trench is covered by said first layer of silicon;
    oxidizing said first layer of silicon, so that the bottom of the trench is covered by an oxide of silicon;
    partially filling said trench with at least a second layer of silicon; and
    oxidizing said second layer of silicon,
    wherein said trench is partially filled with said second layer of silicon after said first layer of silicon is oxidized.

11. The method, as recited in claim 10, further comprising the step of forming a layer of nitride in said trench prior to filling said trench with said layers of silicon.

12. The method, as recited in claim 10, further comprising the steps of:
    forming a layer of pad oxide on said substrate prior to forming said trench;
    forming a layer of silicon nitride on said layer of pad oxide;
    forming a patterned masking layer on said layer of silicon nitride; and
    etching said silicon nitride layer, said pad oxide layer, and said substrate to form said trench.

13. The method, as recited in claim 10, wherein said trench has a predetermined width and a predetermined depth.

14. The method, as recited in claim 13, wherein the ratio of said depth to said width is greater than two.

15. The method, as recited in claim 13, wherein said first layer of silicon is approximately one-third of said depth of said trench.

16. The method, as recited in claim 13, wherein said second layer of silicon is approximately one-third of said depth of said trench.

17. The method, as recited in claim 10, wherein said first layer of silicon comprises amorphous or polycrystalline silicon.

18. The method, as recited in claim 10, wherein said second layer of silicon comprises amorphous or polycrystalline silicon.

19. A method of forming a trench isolation on a semiconductor substrate having a trench with side walls and a bottom, comprising the steps of:
    filling said trench with multiple layers of silicon, said multiple layers including a first layer, at least one intermediate layer and a last layer, the first layer covering the bottom of the trench;
    oxidizing the first layer of silicon and each intermediate layer of silicon before filling said trench with the next layer of silicon; and
    oxidizing the last layer of silicon after filling said trench with the last layer of silicon.

20. The method, as recited in claim 19, further comprising the step of forming a layer of nitride in said trench prior to filling said trench with said layers of silicon.

21. The method, as recited in claim 19, wherein said trench has a predetermined width and a predetermined depth.

22. The method, as recited in claim 21, wherein the ratio of said depth to said width is greater than two.

23. The method, as recited in claim 21, wherein said first layer comprises amorphous or polycrystalline silicon which is approximately one-third of said depth of said trench.

24. The method, as recited in claim 21, wherein said intermediate layer comprises amorphous or polycrystalline silicon which is approximately one-third of said depth of said trench.

* * * * *